May 5, 1970 C. D. HAHN 3,510,368

METHOD OF MAKING A SEMICONDUCTOR DEVICE

Filed Aug. 29, 1966

INVENTOR.
Clarence D. Hahn

BY

Mueller, Aichele & Rauner

ATTY'S.

United States Patent Office 3,510,368

Patented May 5, 1970

3,510,368

METHOD OF MAKING A SEMICONDUCTOR DEVICE

Clarence D. Hahn, Phoenix, Ariz., assignor to Motorola, Inc., Franklin Park, Ill., a corporation of Illinois Filed Aug. 29, 1966, Ser. No. 575,641
Int. Cl. H01l 7/36, 7/46
U.S. Cl. 148—175 3 Claims

ABSTRACT OF THE DISCLOSURE

A diode having a novel reverse breakdown rectifying PN junction and a method of making same. The reverse breakdown rectifying PN junction has a passivated alloy die in which the PN junction comprises solely the interface of the alloy region with the base semiconductor material. The rectifier is made by a method in which a metal is alloyed directly into a body of semiconductor material that has not been previously subjected to a solid state diffusion.

This invention relates to semiconductor junction devices and more particularly to a novel structure and method of fabricating low voltage rectifying junctions having improved reverse bias breakdown characteristics. Although the rectifying junctions provided by this invention are particularly suited for forming low-voltage Zener diodes, the invention is also applicable to Zener diodes of other voltage ranges, and multijunction semiconductor devices of all types.

Zener diodes are primarily utilized in circuits that take advantage of the unique electrical characteristics of Zener diodes under reverse bias voltage conditions. In Zener diodes, when the reverse bias breakdown voltage is exceeded, an avalanche condition occurs resulting in a substantially constant voltage plateau. The region of the characteristic curve at which breakdown occurs in Zener diodes is commonly referred to as the "Zener knee." Preferably, this knee is sharp so that the point of breakdown is clearly defined. Zener diode rectifying junctions may be incorporated into transistor structures with similar problems.

In an attempt to improve the sharpness of the Zener knee and obtain a passivated junction, a combination of solid state diffusion and alloying techniques were utilized to fabricate the dice for Zener diodes. Although these dice provided some improvement over the previous all diffused dice, the yield of devices with satisfactory Zener knees were poor, that is, between about 0 and 10 percent. This yield was partially attributable to faulty structures resulting from improper interrelation of the large number of dependent processing steps and the difficulty of combining solid state diffusion and alloying to form a Zener PN junction. The poor yields were also attributable to the repeated handlings required for each die because of the many processing steps required in the fabrication of the diode.

With the prior method of fabricating such devices, it is believed that the solid state diffusion caused strain in the semiconductor crystal of the die and during the subsequent step of alloying, this strain formed preferential points for alloying, resulting in an uneven interface or PN junction. With the inherent unpredictability associated with such irregularities, it was difficult to fabricate dice requiring precise control of minute dimensions for low voltage diodes.

An object of this invention is to provide a novel reverse breakdown rectifying PN junction, particularly a junction for use at low voltages, having substantially improved reverse bias electrical characteristics.

Another object of this invention is to provide a reverse breakdown rectifying PN junction having a passivated alloy die in which the PN junction comprises solely the interface of the alloy region with the base semiconductor material.

A further object of this invention is to provide a method of fabricating a rectifying semiconductor junction having substantially improved reverse bias electrical characteristics with a die including a passivated PN junction.

A still further object of this invention is to reduce the cost of low voltage rectifying semiconductor junctions by providing a method of fabricating the same in fewer processing steps and with greater accuracy.

A feature of this invention is the provision of a device having a rectifying semiconductor PN junction including a die with an alloy region extending into a body of semiconductor material from one face thereof to form a PN junction with the body, the PN junction terminating under a passivating layer disposed on the face of the body. This PN juction is completely surrounded at the one face by a region of the same conductivity type as the body of semiconductor material but having a much higher resistivity.

Another feature of the invention is a method of fabricating a semiconductor die in which an alloy region constituting a PN junction terminating at a passivated face of the die is formed by alloying a metal directly with a body of semiconductor material that has not been subjected to solid state diffusion.

For purposes of simplicity, this invention is illustrated and described as embodied in a semiconductor diode device. This device is a Zener diode having a body of semiconductor material of one conductivity type having a substantially flat major face. An adherent passivating layer is on this major face and there is an opening in this passivating layer exposing an area of the face. A metal portion, including a dopant, is disposed within the opening contacting the exposed area and extending over the immediately adjacent segment of the passivating layer. A region, of an alloy of the metal and semiconductor material, having a conductivity type different than the one conductivity type projects into the body from the exposed area forming a PN junction with the body that terminates at the face under the passivating layer. A region of the body having the one conductivity type with a substantially higher resistivity than the body surrounds the alloy region adjacent to the PN junction, extending therefrom into the body and terminating at the face with the major portion of the region being adjacent to the face.

The invention is also embodied in a method of fabricating a semiconductor device having a rectifying junction and which includes the steps of disposing on a body of semiconductor material of one conductivity type having a substantially flat major face a region of the semiconductor material on the major face of the same conductivity type with a substantially higher resistivity than the body. A passivating layer is removed and an opening fashioned exposing an area of the high resistivity region.

A metal, including a dopant, is disposed on the passivating layer and the exposed area of the body. This metal is patterned to leave a portion thereof in contact with the exposed area and extending over the passivating layer adjacent to the opening. The metal is alloyed with the semiconductor material establishing an alloy region of different conductivity type than the one conductivity type constituting a PN junction with the body terminating at the face. Ohmic contact is formed with the body and with the metal in contact with the one face.

Figure 1:
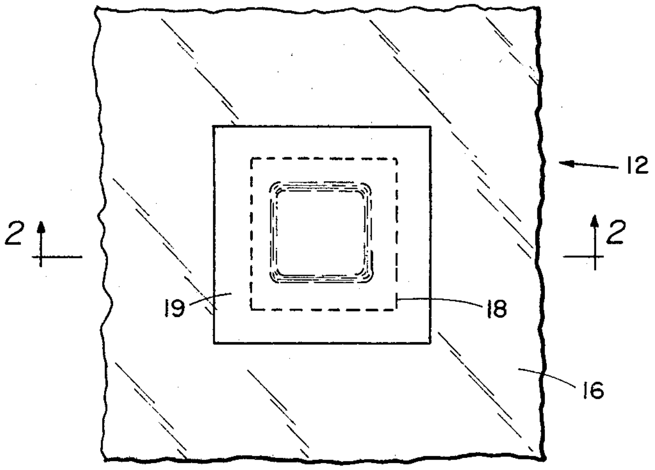
FIG. 1 is an enlarged plan view of a die of a Zener diode according to one embodiment of the invention.

In one embodiment of the invention, a semiconductor die 12 (FIG. 1) includes a metal portion 19 supported on a passivating layer 16. Portion 19 contacts an alloy region 18 (dotted lines) through an opening in layer 16.

Figure 2:
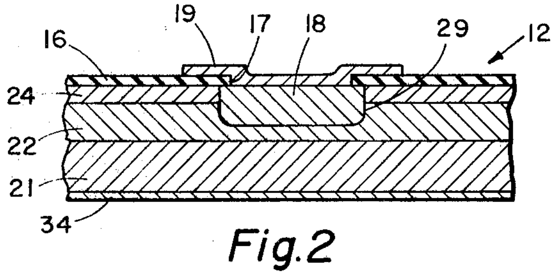
FIG. 2 is a cross-sectional view taken along the line 2—2 of FIG. 1.

The structure of die 12, according to a preferred embodiment of the invention, is shown in FIG. 2. Die 12 is a multilayer body of semiconductor material. This body includes a first layer 21 of semiconductor bulk material which serves as a support for the completed die.

A first region 22 of substantially uniform and controlled resistivity of the same conductivity as layer 21 is supported thereon. Region 22 will generally have a resistivity similar to layer 21. The uniformity and control of the resistivity region 22 is important because this regon is known as the "voltage determining region" in that the reverse bias breakdown voltage of the device will be determined herein.

A second region 24, of the same conductivity type having a substantially higher resistivity than the voltage determining region 22, is supported by regions 22 and forms the top face of the semiconductor body. The surface of region 24 is protected by a passivating layer 16. Passivating layer 16 extends over substantially the entire active face of region 24 and serves to passivate this region and protect it from external contamination. Layer 21 and regions 22, 24 constitute the base semiconductor material.

Die 12 includes an alloy region 18, comprising an alloy of die 12 and a metal, that extends from the face of the high resistivity region 24 into region 22. Alloy region 18 forms a PN junction 29 with regions 22, 24 that terminate at the face of region 24 underneath passivation 16.

A metal portion 19 contacts alloy region 18 through an opening 17 in passivation 16. The perimeter of opening 17 is completely within the perimeter of alloy region 18. Metal portion 19 extends over the surface of passivation 16 beyond the perimeter of alloy region 18. Metal portion 19 also provides an ohmic contact connection for one of the external leads of the final Zener diode.

A solderable ohmic contact 34 is located on the face of die 12 opposite metal portion 19. Contact 34 covers substantially the entire opposite face and is a ready connection for the other external lead of the Zener diode.

Figure 3:
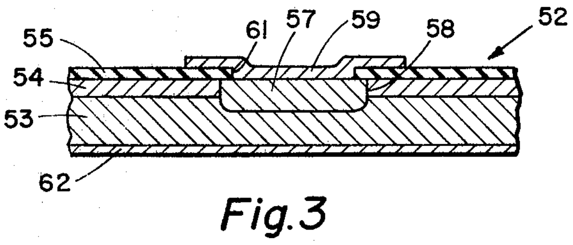

In another embodiment of the invention, a die 52 (FIG. 3) has a voltage determining layer 53 comprising preferably high quality bulk semiconductor material having a substantially uniform resistivity so that the breakdown of the device will be consistent. A first region 54 of the same conductivity type with a substantially higher resistivity is disposed on layer 53 and is protected by a passivating layer 55.

A metal-semiconductor alloy region 57 extends from the face of region 54 with passivation 55 into layer 53, forming a PN junction 58 that terminates under passivation 55. Alloy region 57 is contacted by a metal portion 59 through an opening 61 in passivation 55. The perimeter of opening 61 is completely contained within the perimeter of alloy region 57. Metal portion 59 extends on passivation 55 beyond the perimeter of the termination of PN junction 58.

An ohmic contact 62 is formed on the face of die 52 opposite the face including metal portion 59. The plan view appearance of the top of die 52 is substantially identical to die 12.

Figure 4:
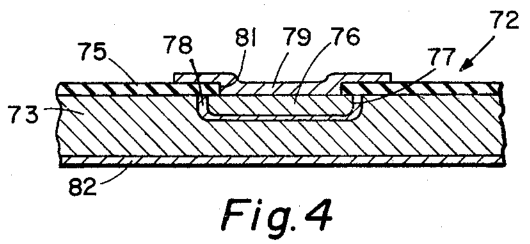
FIGS. 3 and 4 are cross-sectional views of alternate embodiments of the invention having plan views similar to FIG. 1.

In still another embodiment of the invention, a die 72 (FIG. 4) is shown that is preferably utilized for high voltage PN junctions. Die 72 includes a layer 73 preferably selected from semiconductor material having substantially uniform resistivity and closely controlled impurities. One face of layer 73 includes an adherent passivating layer 75.

A metal-semiconductor alloy region 76 extends from the face with passivation 75 into layer 73 forming a PN junction 77 that terminates under passivation 75. Alloy region 76 is surrounded by a region 78, which is believed to be a highly compensated region, extending a greater distance in a direction parallel to passivation 75 than perpendicular thereto.

Region 76 is contacted by a metal portion 79 through an opening 81 in passivation 75. Metal portion 79 extends over the face of passivation 75 beyond the perimeter of alloy region 76 and compensated region 78.

Die 72 has a solderable ohmic contact 82 on the face opposite metal portion 79 similar to ohmic contact 34. The plan view of die 72 is similar to that of die 12 shown in FIG. 1.

Figure 5:
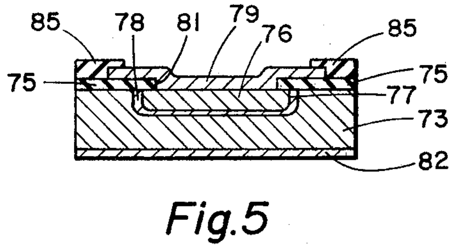
FIG. 5 is an enlarged cross-sectional view of a die utilized for high voltage devices.

The voltage capabilities of die 72 are further increased by depositing insulating layer 85 (FIG. 5) over and around the outer perimeter of metal portion 79. Insulating layer 85 extends from part of the face of metal portion 79 continuously onto passivation 75 and prevents electrical arcing between metal portion 79 and region 73. Of course, insulating layer 85 may be utilized with other embodiments of this invention.

Figure 6:
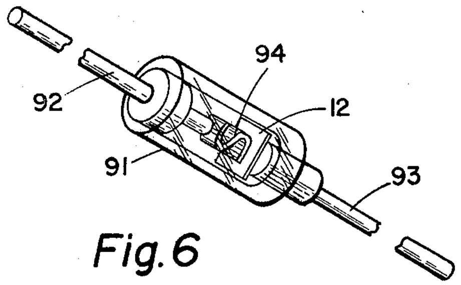
FIG. 6 is an enlarged perspective view of a Zener diode utilizing a die similar to one of those shown in FIG. 2, 3, 4 or 5.

Usually, it is desirable to encapsulate the die of a Zener diode in a package providing protection to the die from variations in moisture, other contaminants, and physical damage. This protection is conveniently provided by a cylindrical glass package 91 (FIG. 6) having two external leads 92, 93 extending from opposite ends. Die 12 is positioned within glass package 91 which is hermetically sealed about leads 92, 93. Die 12 is soldered to lead 93 and electrically contacted to lead 92 by an S bend 94 that presses against it to maintain electrical contact therewith while protecting die 12 from breakage due to the expansion of glass 91 or vibrations encountered in the equipment in which the diode is utilized.

To fabricate die 12, a layer of bulk semiconductor material, a first region of the same conductivity type and a second region of the same conductivity type of a higher resistivity with a passivating layer on one face was treated to form an opening of a preselected size in the passivating layer. This opening was formed utilizing known photoresist techniques. A metal including a dopant was deposited on the face of the die and patterned, in a manner similar to the passivating layer, to form a portion about the opening and extending therethrough.

The semiconductor material and metal were alloyed to form an alloy region extending through the second region into the first region. The metal and semiconductor were alloyed by rapidly inserting them into a furnace maintained at a temperature suitable for alloying. Unlike prior cycles, where the materials were slowly brought up to the temperature for alloying, the materials herein were brought to temperature almost instantaneously. A PN junction was formed at the interface of the alloy region and the first and second regions that terminated under the passivating layer. An ohmic contact was applied to the opposite face to complete the preparation of the die.

The fabrication of die 52 was the same as die 12 except that the substrate comprised a first layer of bulk semiconductor material and a first region of the same conductivity type with a passivating layer on one face.

The fabrication of die 72 was the same as die 12 except that the substrate comprised a single layer of bulk semiconductor material with a passivating layer on one face. The reverse bias breakdown voltage of die 72 was adjusted by varying its time in the alloying furnace.

Relative to the invention described herein, a low voltage Zener diode is considered to be in a range below 4.7 volts reverse bias breakdown voltage. A high voltage Zener diode is in the range of reverse bias breakdown voltages over 4.7 volts. This high voltage range may exceed over 1500 volts.

The die of a Zener diode is generally fabricated from a semiconductor crystal element, such as silicon or germanium, although various semiconductor compounds may be employed. The die is advantageously fabricated from a wafer which is typically obtained from a larger crystal grown by a known crystal pulling or melting process. The larger crystal is sliced into wafers and the wafers lapped, polished and otherwise processed to make their major faces substantially parallel to each other. The cross-sectional dimension of the wafers may be of any value and the thickness of the wafers can be within a practical range; e.g., about 4 to 40 mils. A wafer comprising silicon will usually have a low resistivity between about .007 and 50 ohm-centimeters. With the silicon wafer a plane having a Miller index of {100} is preferred for achieving a satisfactory device.

To fabricate a stable device, it is desirable to have the breakdown occur within the semiconductor material rather than on the surface thereof. With the breakdown occurring consistently within the semiconductor material, the capability of obtaining reproducible device parameters is greatly enhanced. This type of breakdown is commonly referred to as "bulk breakdown" and the layer or region in which it occurs is called the voltage determining layer or region.

In the preferred embodiment of the invention, the bulk breakdown advantageously occurs in material that is epitaxially grown on the substrate. This region can be grown so that it has a substantially uniform resistivity. A doped epitaxial layer is grown by passing a gaseous mixture of a compound including a semiconductor material and a suitable dopant over a hot wafer of semiconductor material. The mixture reacts and a high quality layer grows on the wafer. In the preferred embodiment of the invention, this layer will be N type silicon with a resistivity between about 0.0009 and 50 ohm-centimeters.

To force the breakdown to occur within the bulk of the semiconductor material, a region is formed adjacent to the PN junction at the surface of the die of substantially higher resistivity than the bulk material. This is readily accomplished by growing a top layer of semiconductor material having a higher resistivity than the bulk material by an epitaxial process, as described above. With a voltage determining layer of silicon having a low resistivity between about 0.0009 and 5 ohm-centimeters the high resistivity layer will have a resistivity about 10 or more times higher. When the resistivity of the bulk material is relatively high, the resistivity layer is usually grown as an undoped intrinsic layer. The layer will usually not be truly intrinsic material because of the small amount of auto doping occurring at the reaction temperatures.

Layers of semiconductor material are referred to as N or P type layers according to the conductivity type induced by the dopant utilized. When two layers of similar conductivity type have widely varying resistivities, the layer of very high resistivity is usually referred to as — (minus) region; i.e., N— or P—. An N type bulk silicon material is preferred for the Zener diode of the invention.

The high resistivity region associated with the third embodiment of the invention (FIG. 4) is believed to be a compensated region formed by diffusion of the dopant present in the metal-semiconductor alloy region forming the PN junction into the surrounding area. Although the mechanics of this diffusion are not fully understood, it is believed that there is a tendency for the diffusion of the dopant to occur at a more rapid rate in a direction parallel to the passivation than perpendicular thereto. The amount diffused is so minor that it is insufficient to convert the conductivity type of the surrounding region. However, this highly compensated region has an effect on device characteristics similar to a high resistivity epitaxially deposited layer.

The metal to be alloyed with the semiconductor material may be selected from metals that are known for their doping properties. Preferably, these metals will be easy to deposit and pattern to desired shapes. To form P type regions in silicon, aluminum is preferred because it readily alloys with the semiconductor material, is easy to deposit and pattern, adheres very well to the passivating layer, and permits the ready attachment to the element of the external leads of the device. The extension of this metal over the passivating layer is believed to enhance the passivation of the device. This metal may be selected from other suitable doping metals or metal alloys such as titanium, antimony-gold, etc.

The passivating layer on the face of the element should be stable at the temperatures required for the device processing. This layer should also be capable of retarding the penetration by the metal deposited thereon during the alloying cycle. A penetration through this passivating layer may seriously affect the parameters of the final device. Preferably, this passivating layer will be an oxide of the semiconductor material that is epitaxially deposited or thermally grown. A low temperature deposited glass is also beneficially utilized. Other passivating layers compatible with the processing requirements and materials involved may be used.

The alloy region of the element may be of any convenient configuration. Preferably, these are basic configurations, such as squares or circles, which are easily formed.

The following examples illustrate the fabrication of specific embodiments of the invention, although it is not intended that the examples restrict the scope of the invention.

EXAMPLE I

Wafers of N type silicon bulk material about 1½ inches in diameter and 8 mils thick with a resistivity of about 0.003 ohm-centimeter on which a plurality of dies were to be fabricated, had a first N type layer of silicon about 25 microns thick epitaxially deposited on a face thereof. The first epitaxial layer had a resistivity of about 0.012 ohm-centimeter. A second epitaxial layer of N type silicon was grown on the first epitaxial layer. The second epitaxial layer was about 2 microns thick and had a resistivity of about 0.6 ohm-centimeter. A layer of passivation of silicon dioxide about 2 microns thick was also deposited with an epitaxial process on the N type silicon.

A commercial photoresist was deposited on the surface of the oxide and exposed to light while covered with a photographic mask having a preselected pattern. After the exposure, the photoresist was developed leaving a pattern on the oxide with a desired preselected pattern. The wafers were placed in an etchant that selectively attacked the oxide to remove areas of the oxide and expose portions of the N type layer of silicon.

Aluminum was evaporated on the surface of the oxide and patterned with photoresist to form individual portions of aluminum at each opening in the oxide. The aluminum portions extended into these openings and contacted the face of the silicon. The portions also extended over the surface of the oxide surrounding the opening.

The aluminum and silicon were alloyed together by placing the wafers rapidly into a furnace maintained at a temperature of about 1000° C. The wafers remained in the furnace for about 12 seconds. The wafers were slowly cooled to room temperature to complete the cycle of alloying.

A solderable ohmic contact was formed on the faces of the wafers opposite the aluminum portions by evaporating and alloying aluminum with the silicon material. Additional layers of chromium, silver and gold were evaporated to complete the solderable contacts. The wafers were scribed and broken to form individual dice. Each die was hermetically sealed in a glass package with two external leads.

Some wafers were examined prior to breaking into die and it was found that the alloy region extended to a depth of about 4 microns into the silicon. This region also extended laterally into the silicon about 0.5 micron beyond the opeing in the oxide. When the die was assembled into a final Zener diode, it had a reverse breakdown voltage of about 3.6 and a reverse leakage current of about 0.3 microamp at one volt. The yield of diodes meeting required specifications was between about 60% and 90% higher than yielded with structures previous to the invention.

EXAMPLE II

The procedure of this example was the same as that of Example I except that the dice were fabricated directly on wafers of N type silicon bulk material having a resistivity of about 0.012 ohm-centimeter.

The wafers were retained in the furnace for alloying for about 12 seconds to form the alloy region.

The alloy region of the wafers was found to extend into the silicon bulk material to a depth of about 4 microns and laterally about 0.5 micron beyond the opening in the oxide. Zener diodes assembled with these dice had a reverse breakdown voltage of about 3.6 and a reverse leakage current of about one microamp at one volt.

EXAMPLE III

The procedure of this example was the same as that of Example I except that the dice were fabricated directly on wafers of N type silicon bulk material having a resistivity of 0.1 ohm-centimeter.

The wafers were retained in the furnace for alloying for about 60 minutes at a temperature of about 1010° C.

The assembled devices had a reverse bias breakdown of 60 volts. The reverse leakage current was one nanoamp at 90% breakdown voltage.

The above description, drawings and examples show that the present invention provides a novel, low voltage rectifying junction device having improved reverse bias breakdown characteristics. It is also evident that this structure is applicable to rectifying junctions of other voltage ranges. Moreover, this device has a passivated PN junction comprised solely of the interface of the alloy region and the semiconductor material. Furthermore, a method is provided for fabricating this junction device in a reduced number of processing steps at a reduced cost.

What is claimed is:

1. A method of fabricating a semiconductor device including the steps of epitaxially growing on a body of semiconductor material of one conductivity type having a substantially flat major face a region of said semiconductor material on said major face of said one conductivity type, said region having a substantially higher resistivity than said body; disposing on said high resistivity region an adherent passivating layer; removing a part of said passivating layer and fashioning an opening therein exposing an area of said high resistivity region; disposing a metal including a dopant on said passivating layer and said exposed area; patterning said metal leaving a portion contacting said exposed area and extending over the adjacent segment of said passivating layer; alloying said metal with said body establishing an alloy region of different conductivity type than said one conductivity type constituting a PN junction between said body and said alloy region terminating at said face within the perimeter of said metal portion; contacting said body wtih an ohmic connection and contacting said metal portion with an ohmic connection.

2. The method of claim 1 including the step of disposing on said body prior to said high resistivity region a first region of substantially lower resistivity than said high resistivity region.

3. The method of claim 1 including the step of disposing an insulating layer on the perimeter of said metal portion after alloying said metal into said body, said insulating layer contacting the perimeter of said metal and extending over the edge of said metal to the adjacent surface of said passivating layer, thereby preventing electrical arcing between said metal and said body.

References Cited

UNITED STATES PATENTS

| | | | |
|---|---|---|---|
| 3,303,068 | 2/1967 | Scott | 148—179 |
| 3,309,240 | 3/1967 | Zook et al. | 148—177 |
| 3,341,377 | 9/1967 | Wacker | 148—179 |
| 3,375,417 | 3/1968 | Hull et al. | 148—175 |

RICHARD O. DEAN, Primary Examiner

U.S. Cl. X.R.

148—179, 180, 181, 185